US011139585B2

(12) United States Patent
Saito et al.

(10) Patent No.: US 11,139,585 B2
(45) Date of Patent: Oct. 5, 2021

(54) PHASED ARRAY ANTENNA

(71) Applicant: Mitsubishi Electric Corporation, Chiyoda-ku (JP)

(72) Inventors: Yukari Saito, Tokyo (JP); Hiroaki Matsuoka, Tokyo (JP); Keisuke Nishi, Tokyo (JP); Masayuki Saito, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 288 days.

(21) Appl. No.: 16/475,830

(22) PCT Filed: Jan. 23, 2017

(86) PCT No.: PCT/JP2017/002148
§ 371 (c)(1),
(2) Date: Jul. 3, 2019

(87) PCT Pub. No.: WO2018/135003
PCT Pub. Date: Jul. 26, 2018

(65) Prior Publication Data

US 2019/0356055 A1 Nov. 21, 2019

(51) Int. Cl.
*H01Q 21/00* (2006.01)
*H01Q 21/06* (2006.01)
(Continued)

(52) U.S. Cl.
CPC ........... *H01Q 21/0025* (2013.01); *H01Q 1/02* (2013.01); *H01Q 3/26* (2013.01); *H01Q 21/065* (2013.01); *H01Q 21/08* (2013.01); *H01Q 23/00* (2013.01)

(58) Field of Classification Search
None
See application file for complete search history.

(56) References Cited

U.S. PATENT DOCUMENTS 5,023,634 A * 6/1991 Nishioka ........... H01L 23/49822 342/157
5,099,254 A * 3/1992 Tsukii .................... H01Q 1/002 343/853
(Continued)

FOREIGN PATENT DOCUMENTS

EP 1 151 317 4/2000
JP 59-112163 U 7/1984
(Continued)

OTHER PUBLICATIONS

European Office Action dated Dec. 23, 2020 in European Patent Application No. 17 892 456.9.
(Continued)

*Primary Examiner* — Ab Salam Alkassim, Jr.
(74) *Attorney, Agent, or Firm* — Oblon, McClelland, Maier & Neustadt, L.L.P.

(57) ABSTRACT

A phased array antenna includes a front plate, a plurality of blocks including a plurality of slices that include a plurality of transmitters and a circuit board that distributes a power supply, a control signal, and a high-frequency signal to the plurality of slices, the blocks being held on a first face of the front plate, a plurality of power sources that supply power to the blocks, which is held on the first face of the front plate, an antenna element layer in which a plurality of antenna elements are arrayed, which is held on a second face of the front plate, and a high-frequency signal wiring layer including high-frequency signal wiring through which a high-frequency signal to the antenna elements passes.

13 Claims, 7 Drawing Sheets

(51) Int. Cl.

| | |
|---|---|
| ***H01Q 21/08*** | (2006.01) |
| ***H01Q 23/00*** | (2006.01) |
| ***H01Q 1/02*** | (2006.01) |
| ***H01Q 3/26*** | (2006.01) |

(56) References Cited

U.S. PATENT DOCUMENTS

| | | | | | |
|---|---|---|---|---|---|
| 5,278,574 | A * | 1/1994 | Zimmerman | H01Q 21/0087 333/245 |
| 5,745,076 | A * | 4/1998 | Turlington | G01S 7/032 342/372 |
| 5,812,089 | A * | 9/1998 | Locke | H01Q 3/2605 342/371 |
| 5,854,607 | A * | 12/1998 | Kinghorn | H01Q 21/0087 343/853 |
| 6,005,531 | A * | 12/1999 | Cassen | H01Q 21/0087 343/853 |
| 6,184,832 | B1 * | 2/2001 | Geyh | H01Q 1/02 343/700 MS |
| 6,366,238 | B1 * | 4/2002 | DeMore | H01Q 21/0025 342/368 |
| 6,429,816 | B1 * | 8/2002 | Whybrew | H01Q 21/0087 343/700 MS |
| 6,469,671 | B1 * | 10/2002 | Pluymers | G01S 7/032 343/700 MS |
| 6,876,323 | B2 * | 4/2005 | Feldle | H01Q 21/0025 342/157 |
| 7,289,078 | B2 * | 10/2007 | Navarro | H01Q 13/02 343/778 |
| 7,417,598 | B2 * | 8/2008 | Navarro | H01Q 21/061 342/368 |
| 9,192,047 | B2 * | 11/2015 | Tevell | H01Q 21/0025 |
| 10,310,009 | B2 * | 6/2019 | Thompson | G01R 1/06722 |
| 10,750,641 | B2 * | 8/2020 | Egami | F28F 3/06 |
| 11,011,822 | B2 * | 5/2021 | Kuwahara | H01Q 1/38 |
| 2006/0090489 | A1 * | 5/2006 | Haws | H05K 7/20309 62/176.6 |
| 2010/0066631 | A1 * | 3/2010 | Puzella | H01Q 21/0087 343/853 |
| 2012/0068906 | A1 * | 3/2012 | Asher | H01Q 21/0025 343/853 |
| 2012/0218149 | A1 * | 8/2012 | Edward | H01Q 21/0025 342/368 |
| 2013/0321239 | A1 * | 12/2013 | Bingham | H01Q 5/40 343/879 |
| 2016/0218412 | A1 * | 7/2016 | Day | H01Q 21/0087 |
| 2018/0310436 | A1 * | 10/2018 | Egami | F28F 13/14 |
| 2018/0316096 | A1 * | 11/2018 | Harauchi | H01Q 21/0093 |
| 2019/0013580 | A1 * | 1/2019 | Vigano | H01Q 21/0093 |

FOREIGN PATENT DOCUMENTS

| | | | |
|---|---|---|---|
| JP | 2001-196848 | A | 7/2001 |
| JP | 2003-110330 | A | 4/2003 |
| JP | 2009-159430 | A | 7/2009 |
| JP | 4844554 | B2 | 12/2011 |
| JP | 2014-239371 | A | 12/2014 |
| WO | WO 00/20881 | A2 | 4/2000 |
| WO | WO 00/20881 | A3 | 4/2000 |

OTHER PUBLICATIONS

International Search Report dated Mar. 14, 2017 in PCT/JP2017/002148 filed Jan. 23, 2017.

Extended European Search Report dated Nov. 20, 2019 in corresponding European Patent Application No. 17892456.9, 10 pages.

* cited by examiner

PHASED ARRAY ANTENNA

FIELD

The present invention relates to a phased array antenna including a plurality of arrayed antenna elements.

BACKGROUND

A phased array antenna includes a plurality of antenna elements, a transmitter corresponding to each antenna element, a power feeder and a power source connected to the transmitter, and a cooler for cooling the transmitter. Note that the term "transmitter" in the descriptions indicates a module having at least a transmission function, which also includes a transmission/reception module having a reception function as well. The phased array antenna arranges the plurality of antenna elements regularly in a matrix to form an antenna aperture. In general, a series of constituent elements accompanying the antenna element is also arranged regularly in a similar manner due to the configuration of the antenna. As disclosed in Patent Literature 1, there is a phased array antenna in which a plurality of antenna elements and a series of constituent elements accompanying the antenna element are unitized.

In the invention disclosed in Patent Literature 1, a tabular antenna unit is formed by the plurality of antenna elements, a transmitter, a power source, a power feed controller, and a cooler. In the following descriptions, the tabular antenna unit is referred to as a slice. In the invention disclosed in Patent Literature 1, the antenna element and the transmitter are integrated and fixed to the cooler, and the power feed controller and the power source also fixed to the cooler are connected via a cable. Furthermore, a plurality of arranged slices and a mother board for distributing and supplying the power, a control signal, and a high-frequency signal are integrated to form a cube structure antenna. In the following descriptions, the cube structure antenna is referred to as a block. In the invention disclosed in Patent Literature 1, a plurality of blocks are arranged in a matrix and attached to an antenna frame, thereby forming an array antenna. In the invention disclosed in Patent Literature 1, a shape of the antenna frame is changed within a range conforming to the block size, and the number of blocks arranged in a matrix is changed, whereby an aperture diameter of the array antenna can be set freely.

CITATION LIST

Patent Literature

Patent Literature 1: Japanese Patent No. 4844554

SUMMARY

Technical Problem

A pitch of arrangement of the antenna elements serving as the aperture requires high mounting accuracy. Accordingly, in the invention disclosed in Patent Literature 1, a component in which the antenna element and the transmission module are integrated needs to be positioned highly accurately in the slice. Besides, when a plurality of slices are arranged in the block and when the blocks are arrayed and mounted on the antenna frame, high mounting accuracy is required similarly. Therefore, the cost increases inevitably.

In addition, in the invention disclosed in Patent Literature 1, all the antenna elements mounted on a plurality of blocks need to be arranged in an equal pitch. Accordingly, when the blocks are mounted on the antenna frame, it is necessary to arrange the pitch of the slices between adjacent blocks to be equal to the pitch of the slices in the block. Therefore, according to the invention disclosed in Patent Literature 1, structures of the antenna frame and the block are strictly limited.

The present invention has been achieved in view of the above, and an object of the present invention is to obtain a phased array antenna in which mounting accuracy of components included in a block can be lowered, and an arrangement interval of slices in adjacent blocks does not need to coincide with an arrangement interval of slices within the block.

Solution to Problem

In order to solve the problems described above and to achieve the object, a phased array antenna of the present invention includes: a front plate on which a flow path for coolant is formed; a plurality of blocks including a plurality of slices that include a plurality of transmitters and a circuit board for distributing a power to the transmitters to control operation and for controlling a passing phase of a high-frequency signal; a bus board for distributing a power, a control signal, and a high-frequency signal to the plurality of slices; the blocks being held on a first face of the front plate, a plurality of power sources that supply power to the blocks, which is held on the first face of the front plate, an antenna element layer in which a plurality of antenna elements are arrayed, which is held on a second face on the back of the first face of the front plate, and a high-frequency signal wiring section including high-frequency signal wiring through which a high-frequency signal to the antenna elements passes, which is held on the second face of the front plate. The front plate has a through hole. The transmitter includes a connector electrically connected to the high-frequency signal wiring via the through hole.

Advantageous Effects of Invention

The phased array antenna according to the present invention can relax mounting accuracy of components included in a block, and an arrangement interval of slices in adjacent blocks does not need to coincide with an arrangement interval of slices within the block.

DESCRIPTION OF EMBODIMENTS

Hereinafter, a phased array antenna according to embodiments of the present invention will be described in detail with reference to the accompanying drawings. Note that those embodiments do not limit the present invention.

First Embodiment

Figure 1:
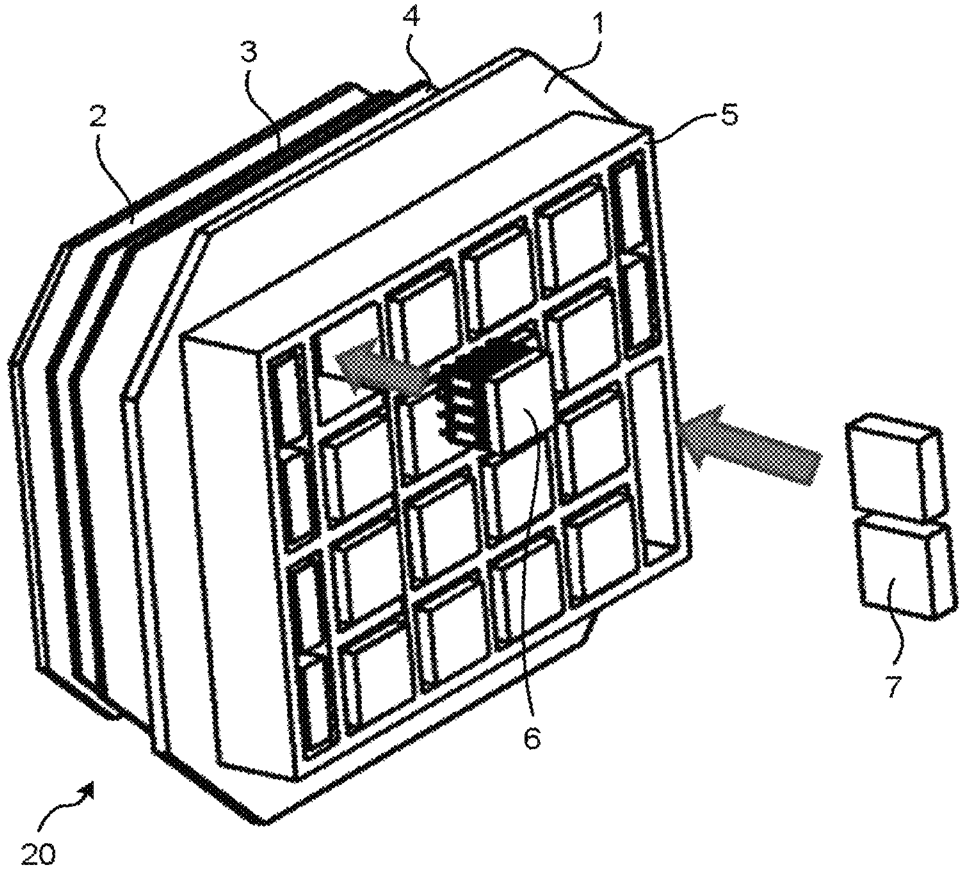
FIG. 1 is a view illustrating a configuration of a phased array antenna according to a first embodiment of the present invention.

FIG. 1 is a view illustrating a configuration of a phased array antenna according to a first embodiment of the present invention. A phased array antenna 20 according to the first embodiment includes: a front plate 1 that includes, inside thereof, a flow path through which coolant flows; an antenna element layer 2 that serves as an antenna element arrangement section in which a plurality of antenna elements are arrayed; a high-frequency signal wiring layer 3 that serves as a high-frequency signal wiring section including high-frequency signal wiring through which a high-frequency signal passes; a power control wiring layer 4 that includes power supply wiring and control signal wiring; an antenna frame 5 that is a lattice frame body; a block 6 that includes a plurality of slices; and a power source 7 that supplies power to the antenna element. The antenna frame 5 is attached to the back face of the front plate 1 that is a first face of the front plate 1, and a plurality of blocks 6 and the power source 7 are attached to the antenna frame 5. Further, the front plate 1 holds the antenna element layer 2, the high-frequency signal wiring layer 3, and the power control wiring layer 4 on the front face thereof that is a second face. The second face as the front face is on the back of the first face as the back face. The front plate 1 serves as a heat dissipation path for heat generated from the antenna element layer 2, the high-frequency signal wiring layer 3, the power control wiring layer 4, the block 6, and the power source 7. That is, the heat generated in the antenna element layer 2, the high-frequency signal wiring layer 3, the power control wiring layer 4, the block 6, and the power source 7 is discharged to the outside of the phased array antenna 20 by the coolant flowing through the flow path inside the front plate 1.

Figure 2:
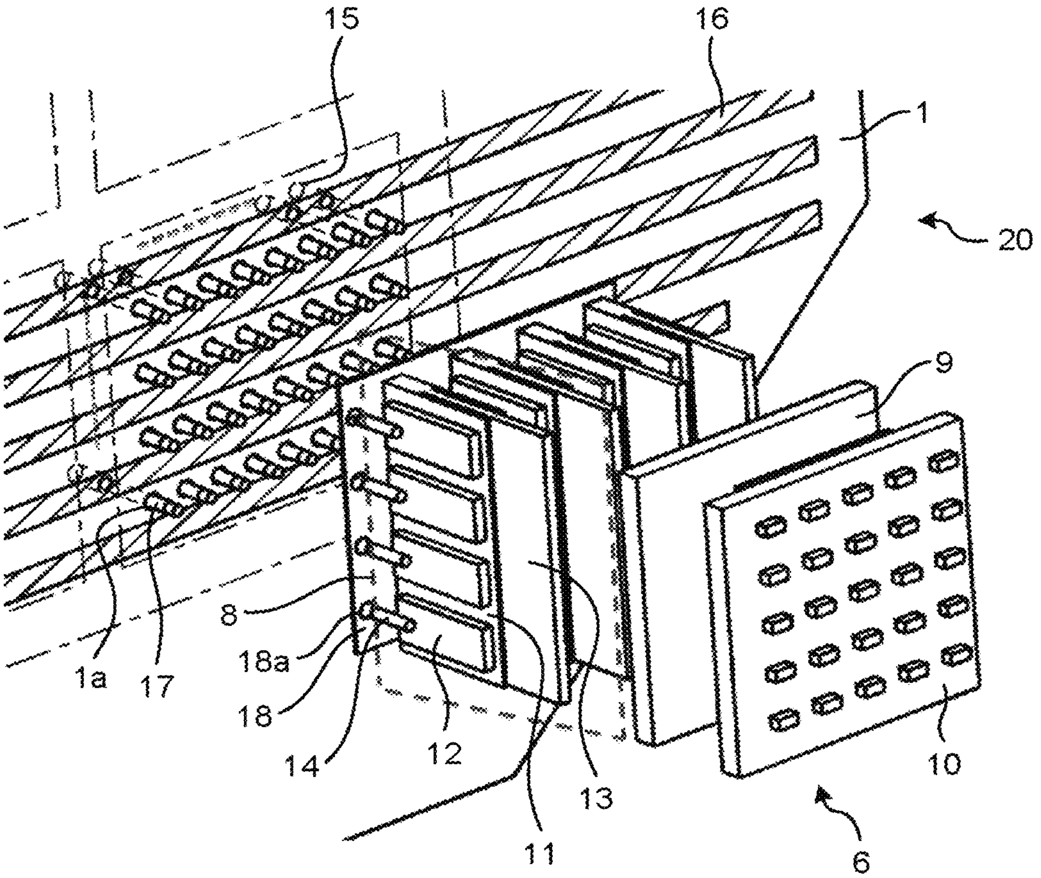
FIG. 2 is a view illustrating a configuration of a block of the phased array antenna according to the first embodiment.

FIG. 2 is a view illustrating a configuration of a block of the phased array antenna according to the first embodiment. The block 6 includes: a plurality of aligned slices 8; a bus board 9 that distributes a power, a control signal, and a high-frequency signal to each slice 8; and a capacitor bank 10 that supplements power supply to the slice 8 at the time of transmitting the high-frequency signal and supplies power at the rising of a pulse. In other words, the capacitor bank 10 supplements the power supply from the power source 7. The capacitor bank 10 is soldered and fixed to the bus board 9. A cover for covering the capacitor bank 10 may be provided. With the cover for covering the capacitor bank 10 being made of a conductive material, an electromagnetic wave radiated from the capacitor bank 10 at the time of charging and discharging the capacitor bank 10 can be shield.

The slice 8 includes: a heat spreader 11 that is a structural heat transfer member; a transmitter 12 that includes a multilayer resin substrate on which a device having a microwave circuit is mounted; a circuit board 13 that distributes a power to the transmitter 12, controls operation of the transmitter 12, and controls a phase of a high-frequency signal to be transmitted to the transmitter 12; and a thermal sheet 18 that conducts heat of the heat spreader 11 to the front plate 1. A plurality of transmitters 12 are aligned and attached to each of a plurality of heat spreaders 11. The microwave circuit of the transmitter 12 is covered with a metallic cover or a plated dielectric cover, thereby being subject to packaging processing of an electromagnetic shield. Accordingly, it is unnecessary to additionally provide a cover for electromagnetic shielding outside the transmitter 12. The circuit board 13 is attached to the heat spreader 11. The circuit board 13 is electrically connected to the transmitter 12. A coaxial connector 14 that is a first coaxial connector is mounted on a surface of each of the plurality of transmitter 12. The thermal sheet 18 has a hole 18*a* through which the coaxial connector 14 penetrates.

A coaxial connector 15 that is a second coaxial connector is mounted on the high-frequency signal wiring layer 3 held on the front face of the front plate 1. A relay adapter 17 that connects the coaxial connector 14 and the coaxial connector 15 is attached to the coaxial connector 15. The front plate 1 has a through hole 1*a* through which the relay adapter 17 can penetrate formed at the pitch same as the pitch of the coaxial connector 15. The power control wiring layer 4 has a through hole 4*a* through which the coaxial connector 14 penetrates formed at the pitch same as the pitch of the coaxial connector 14.

When the block 6 and the front plate 1 are connected, each coaxial connector 14 mounted on each transmitter 12 in the slice 8 and each coaxial connector 15 connected to the high-frequency signal wiring layer 3 are simultaneously fitted to each other via the relay adapter 17. The strength of fitting between the coaxial connector 15 and the relay adapter 17 is stronger than the strength of fitting between the coaxial connector 14 and the relay adapter 17. Therefore, when the block 6 is separated from the front plate 1, the fitting between the coaxial connector 14 and the relay adapter 17 is released, and the relay adapter 17 remains on the side of the coaxial connector 15.

Figure 3:
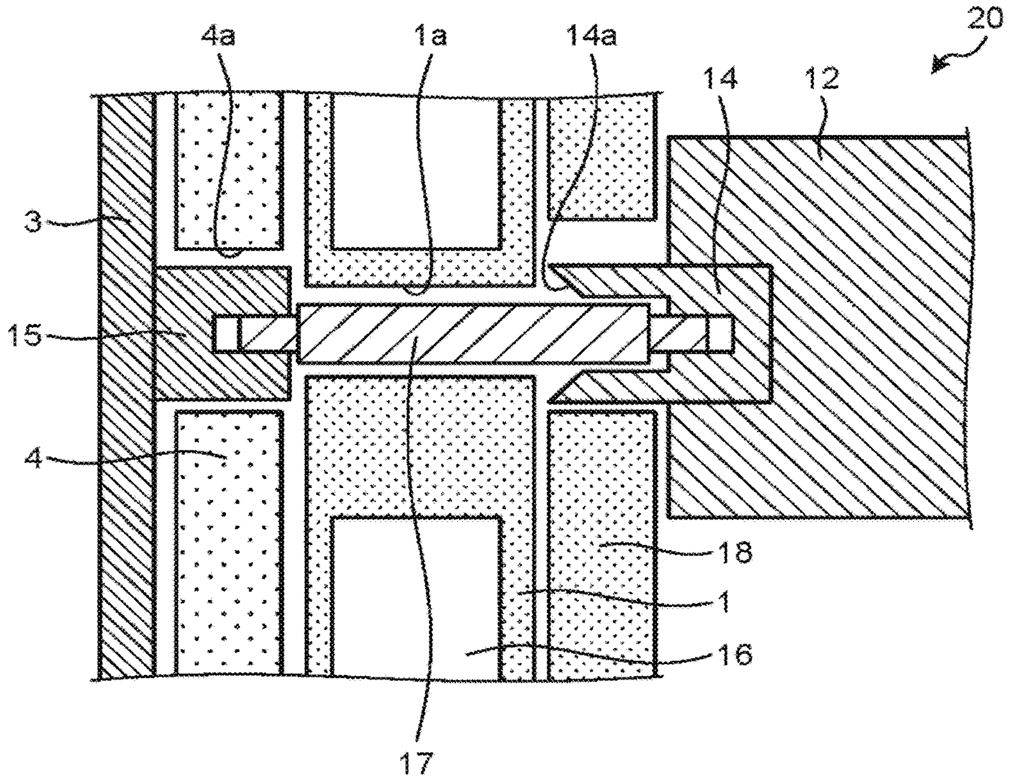
FIG. 3 is a cross-sectional view of the phased array antenna according to the first embodiment in a state where a relay adapter is not tilted.
Figure 4:
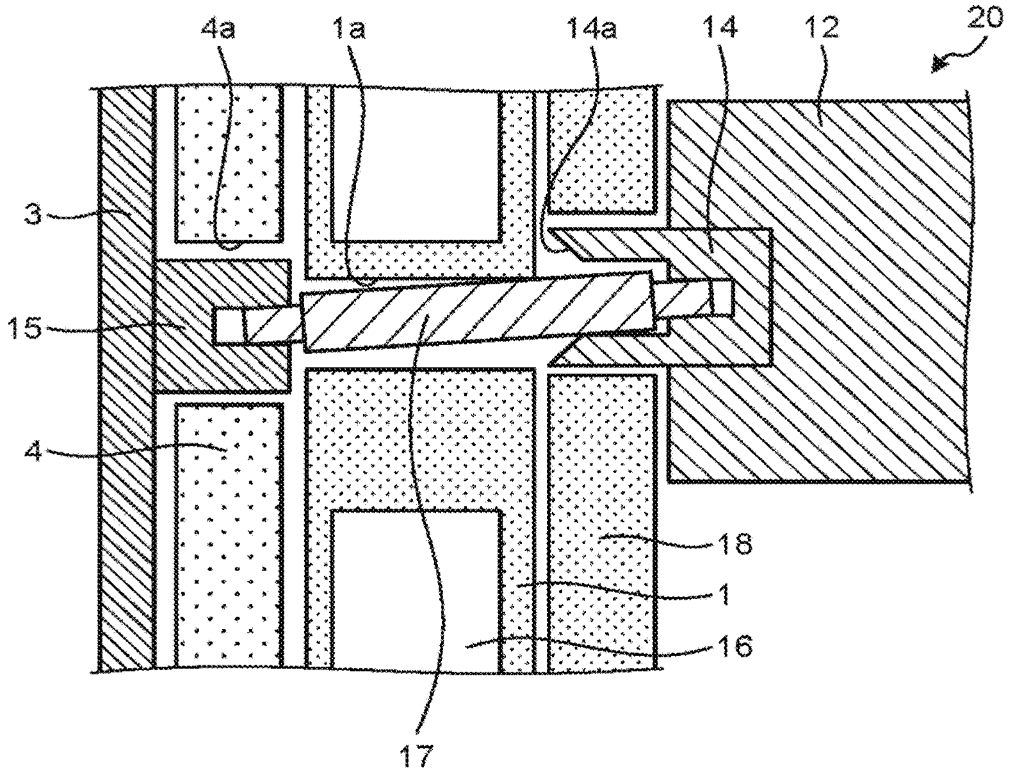
FIG. 4 is a cross-sectional view of the phased array antenna according to the first embodiment in a state where the relay adapter is tilted.

FIG. 3 is a cross-sectional view of the phased array antenna according to the first embodiment in a state where the relay adapter is not tilted. FIG. 4 is a cross-sectional view of the phased array antenna according to the first embodiment in a state where the relay adapter is tilted. As illustrated in FIG. 3, the inner diameter of the through hole 1*a* of the front plate 1 is larger than the outer diameter of the relay adapter 17. Therefore, as illustrated in FIG. 4, the relay adapter 17 can tilt to a position where it contacts the edge of the through hole 1*a* of the front plate 1. Here, a tip of the coaxial connector 14 has a guide part 14*a* for guiding the relay adapter 17 to the center so that the coaxial connector 14 is fitted to the relay adapter 17 penetrating through the through hole 1*a* formed in the front plate 1 after the relay adapter 17 is connected to the coaxial connector 15. In the case where the coaxial connector 14 is to be fitted to the relay adapter 17 in a state where the axis of the coaxial connector 15 and the axis of the coaxial connector 14 are misaligned, the relay adapter 17 is tilted, thereby securing electrical connection between the coaxial connector 14 and the coaxial connector 15. Accordingly, when the relay adapter 17 is used, required mounting accuracy of the block 6 can be relaxed compared with a structure not including the relay adapter 17.

However, in order to ensure continuity at the contact portion between the coaxial connector 15 and the relay adapter 17 and continuity at the contact portion between the coaxial connector 14 and the relay adapter 17, inclination of the relay adapter 17 is limited. That is, when the relay adapter 17 is tilted beyond the limit, the coaxial connectors 14 and 15 and the relay adapter 17 are not conducted, whereby the electrical connection between the coaxial connector 14 and the coaxial connector 15 cannot be secured. In view of the above, in the phased array antenna 20 according to the first embodiment, the inner diameter of the through hole 1*a* of the front plate 1 is set such that the inclination of the relay adapter 17 is set within a range that can secure the continuity at the contact portion between the coaxial connector 15 and the relay adapter 17 and the continuity at the contact portion between the coaxial connector 14 and the relay adapter 17.

Although the coaxial connector 14 is fitted to the relay adapter 17 connected to the coaxial connector 15 on the side of the high-frequency signal wiring layer 3 in the descriptions above, the relay adapter 17 may be connected to the coaxial connector 14 first and then fitted to the coaxial connector 15. In such a case, the guide part for guiding the relay adapter 17 is preferably included in the coaxial connector 15.

Although the strength of fitting between the coaxial connector 15 and the relay adapter 17 is made stronger than the strength of fitting between the coaxial connector 14 and the relay adapter 17 in the descriptions above, it may be made reversely. In such a case, when the block 6 is separated from the front plate 1, the fitting between the coaxial connector 15 and the relay adapter 17 is released, and the relay adapter 17 remains on the side of the coaxial connector 14. In this case as well, the guide part for guiding the relay adapter 17 is preferably included in the coaxial connector 15.

Figure 5:
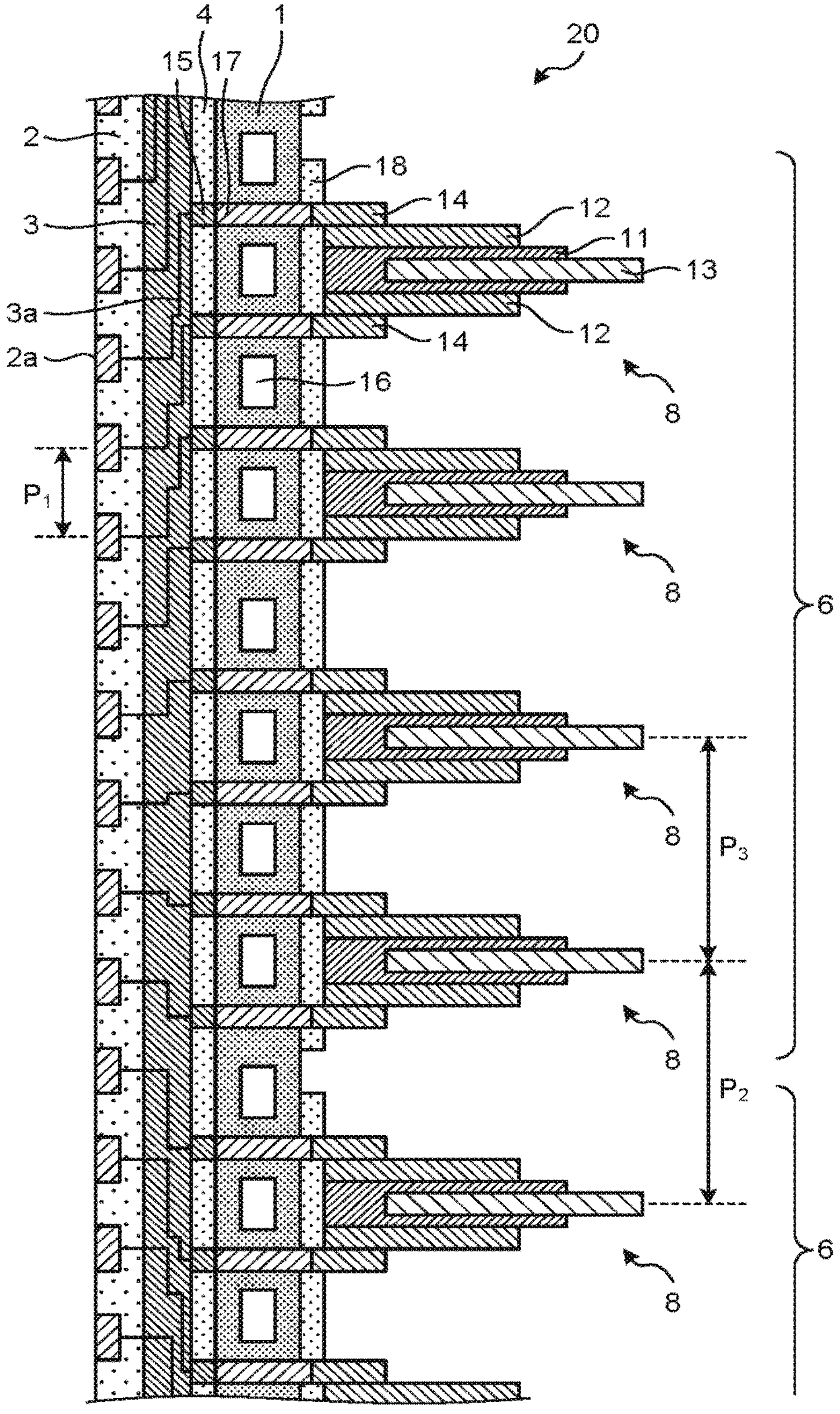
FIG. 5 is a view illustrating a positional relationship between an antenna element and a coaxial connector on the side of a high-frequency signal wiring layer of the phased array antenna according to the first embodiment.

FIG. 5 is a view illustrating a positional relationship between the antenna element and the coaxial connector on the side of the high-frequency signal wiring layer of the phased array antenna according to the first embodiment. As described above, the front plate 1 includes a flow path 16 for cooling between the rows of the through holes 1*a*. A pitch $P_1$ between the antenna elements 2*a* is shorter than both a pitch $P_2$ of the slices 8 of adjacent blocks 6 and a pitch $P_3$ of the slices 8 within the block 6. A high-frequency signal wiring 3*a* is shifted in the in-plane direction in the high-frequency signal wiring layer 3, whereby the antenna element 2*a* and the coaxial connector 15 are electrically connected to each other. Further, this structure enables the pitch $P_2$ of the slices 8 of the adjacent blocks 6 to be independent of the pitch $P_1$ of the antenna elements 2*a*, whereby limitation in structure of the antenna in which a pitch of slices of adjacent blocks needs to coincide with a pitch of slices within a block, which is a problem in the invention disclosed in Patent Literature 1, can be eliminated. Furthermore, the antenna elements 2*a* are arrayed in the antenna element layer 2, whereby the mounting accuracy of the slice 8 in the block 6 and the mounting accuracy of the transmitter 12 in the slice 8 are independent of the pitch of the antenna elements 2*a*. Therefore, the arrangement accuracy of the antenna element 2*a* can be improved without increasing the mounting accuracy of the block 6.

Although the structure in which 16 blocks 6 and 8 power source 7 are mounted has been described in the descriptions above, it is also possible to employ another configuration of the phased array antenna 20 in which the number of mounted blocks 6 and the number of mounted power source 7 are different from those in the example described above. For example, the phased array antenna 20 may include 12 blocks 6 and six power sources 7. The aperture diameter of the phased array antenna 20 can be set freely by changing the number of blocks 6 to be arranged. Note that the number of power sources 7 is optional, and is not limited to the number mentioned above.

As described above, the slice 8 does not individually include a power supply circuit board, a cooling plate through which the coolant flows, and a piping joint, whereby the slice 8 can be downsized and densely configured. Therefore, the phased array antenna 20 according to the first embodiment can suppress an increase in size and cost. In addition, the phased array antenna 20 according to the first embodiment can reduce the number of components, whereby assembling workability of the block is not lowered.

In the phased array antenna 20 according to the first embodiment, the antenna elements 2*a* are arranged in the antenna element layer 2 so that the influence on the pitch of the antenna element 2*a* exerted by the mounting accuracy of the transmitter 12 in the slice 8 and the mounting accuracy of the slice 8 in the block 6 can be relaxed, whereby the mounting accuracy of components included in the block can be reduced. Furthermore, the pitch that is the arrangement interval of the transmitters 12 does not need to coincide with the pitch that is the arrangement interval of the antenna elements 2*a*. Therefore, the manufacturing cost of the phased array antenna 20 can be reduced, and the manufacturing yield can be improved.

Second Embodiment

Figure 6:
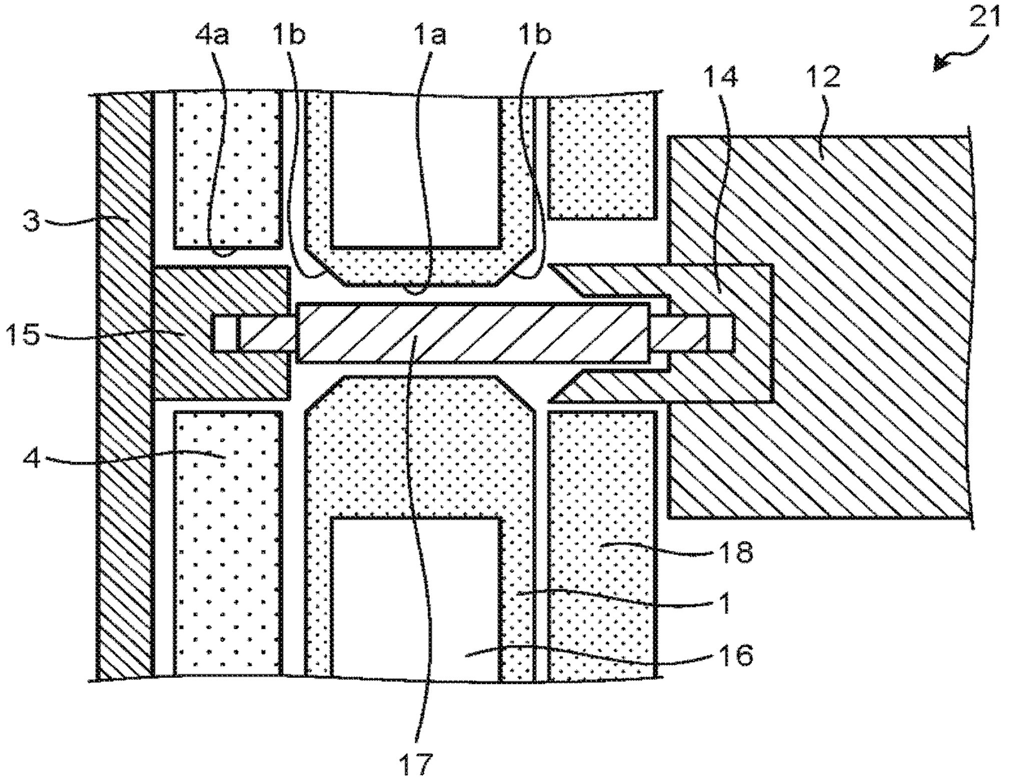
FIG. 6 is a view illustrating a configuration of a phased array antenna according to a second embodiment of the present invention.

FIG. 6 is a view illustrating a configuration of a phased array antenna according to a second embodiment of the present invention. A phased array antenna 21 according to the second embodiment is different from the phased array antenna 20 according to the first embodiment in that a chamfer 1*b* is provided in a through hole of the front plate 1.

Since the phased array antenna 21 according to the second embodiment includes the chamfer 1*b* in the through hole 1*a*, even when the relay adapter 17 abuts on the chamfer 1*b* while passing through the through hole 1*a*, the relay adapter 17 is guided toward the center of the through hole 1*a* by the chamfer 1*b*. Therefore, the work of causing the relay adapter 17 to pass through the through hole 1*a* can be easily performed.

Third Embodiment

Figure 7:
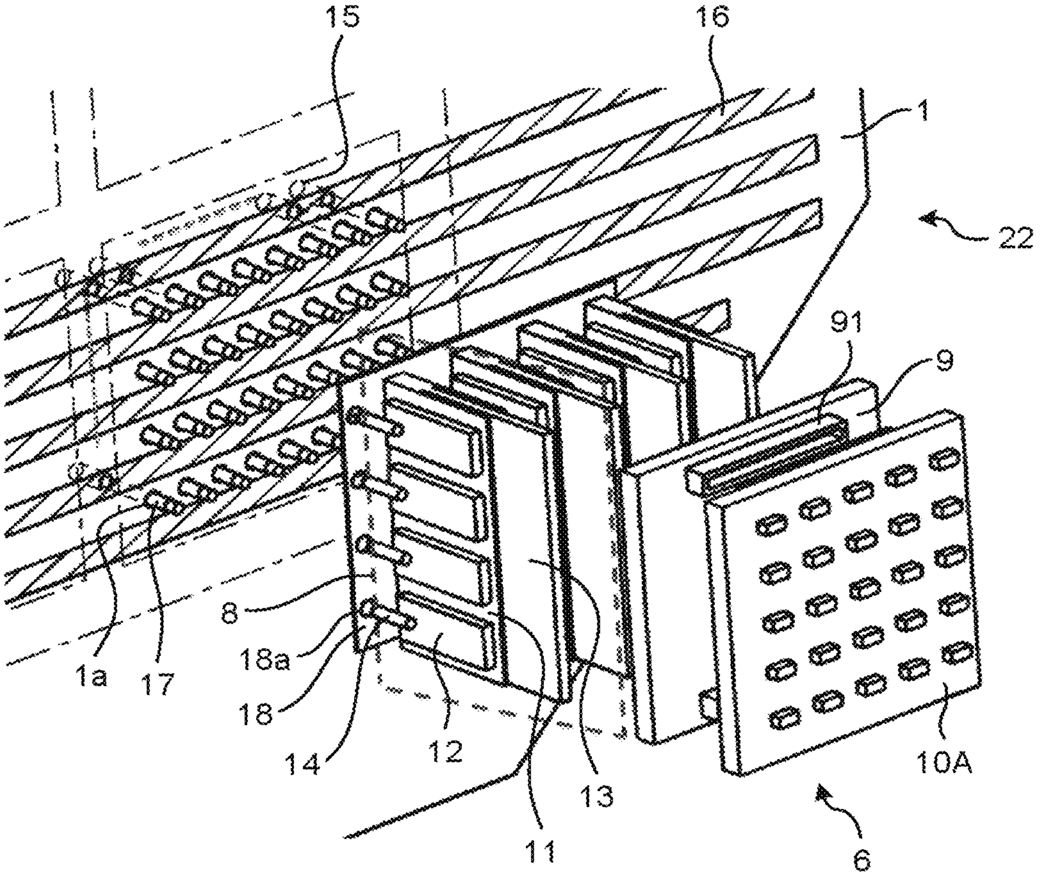
FIG. 7 is a view illustrating a configuration of a phased array antenna according to a third embodiment of the present invention.

FIG. 7 is a view illustrating a configuration of a phased array antenna according to a third embodiment of the present invention. A phased array antenna 22 according to the third embodiment is different from the phased array antenna 20 according to the first embodiment in that a connector 91 is mounted on the bus board 9 and a capacitor bank 10A is detachably mounted on the bus board 9 using the connector 91.

Figure 8:
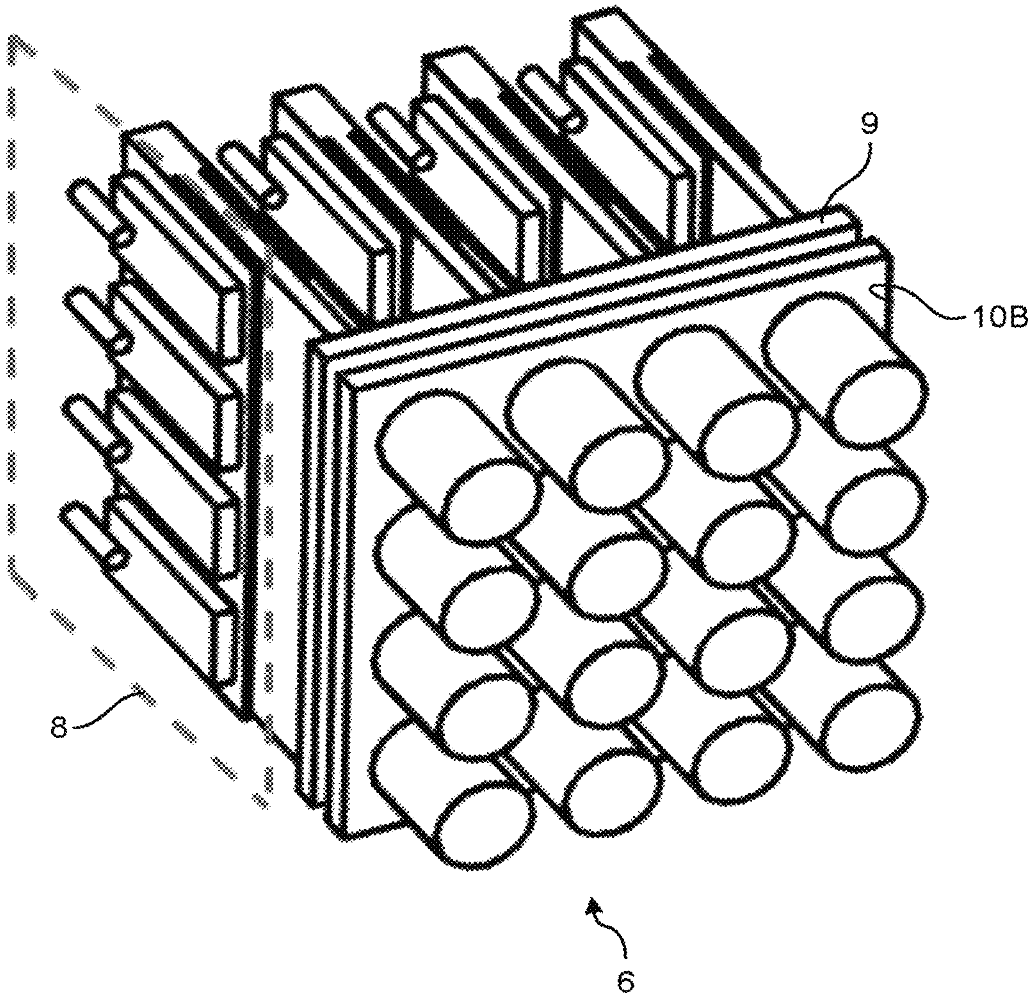
FIG. 8 is a view illustrating the phased array antenna according to the third embodiment in a state where a capacitor bank of a block has been replaced.

FIG. 8 is a view illustrating the phased array antenna according to the third embodiment in a state where a capacitor bank of a block has been replaced. Although the original capacitor bank 10A can be attached to the block 6, it is also possible to attach a capacitor bank 10B different from the original one, as illustrated in FIG. 8.

According to the phased array antennas 20 and 21 according to the first and second embodiments in which the capacitor bank 10 is not detachable from the bus board 9, the block 6 cannot be shared between products having different operation conditions, resulting in an increase in cost. The invention disclosed in Patent Literature 1 does not mention installation of a capacitor bank itself, and thus there is no mention of the arrangement of making the capacitor bank detachable in the disclosure. Accordingly, when a capacitor bank is added to the invention disclosed in the Patent Literature 1, it becomes a structure in which a block cannot be shared between products having different operation conditions. Meanwhile, in the phased array antenna 22 according to the third embodiment, the block 6 can be shared between products having different operation conditions, except for the capacitor banks 10A and 10B. That is, components other than the capacitor banks 10A and 10B can be diverted between products having different operation conditions, whereby a decrease in cost based on the component sharing can be achieved. In addition, even when the operation condition is changed after operation of the phased array antenna 22, it is not necessary to replace the entire block 6, and is only necessary to replace at least the capacitor banks 10A and 10B.

Although the exemplary case where one of the two types of capacitor banks 10A and 10B is attached to the block 6 has been described in the descriptions above, the phased array antenna 22 according to the third embodiment can be used with the capacitor banks 10A and 10B being removed therefrom.

The configuration described in the embodiment above indicates an example of the contents of the present invention. The configuration can be combined with another publicly known technique, and a part of the configuration can be omitted or changed without departing from the gist of the present invention.

REFERENCE SIGNS LIST

1 front plate; 1*a*, 4*a* through hole; 1*b* chamfer; 2 antenna element layer; 2*a* antenna element; 3 high-frequency signal wiring layer; 3*a* high-frequency signal wiring; 4 power control wiring layer; 5 antenna frame; 6 block; 7 power source; 8 slice; 9 bus board; 10, 10A, 10B capacitor bank; 11 heat spreader; 12 transmitter; 13 circuit board; 14, 15 coaxial connector; 14*a* guide part; 16 flow path; 17 relay adapter; 18 thermal sheet; 18*a* hole; 20, 21, 22 phased array antenna; 91 connector.

The invention claimed is:

1. A phased array antenna comprising:

a front plate on which a flow path for coolant is formed;

a plurality of blocks including a plurality of slices that includes a plurality of transmitters and a circuit board to distribute a power to the transmitters to control operation and to control a passing phase of a high-frequency signal, and a bus board to distribute a power, a control signal, and a high-frequency signal to the plurality of slices, the blocks being held on a first face of the front plate;

a plurality of power sources to supply power to the blocks, the power sources being held on the first face of the front plate;

an antenna element layer in which a plurality of antenna elements are arrayed, the antenna element layer being held on a second face on the back of the first face of the front plate; and a high-frequency signal wiring layer including high-frequency signal wiring through which a high-frequency signal to the antenna elements passes, the high-frequency signal wiring layer being held on the second face of the front plate, wherein the front plate has a through hole, the transmitters include a connector electrically connected to the high-frequency signal wiring via the through hole, and the high-frequency signal wiring is shifted in an in-plane direction of the front plate in the high-frequency signal wiring layer, a pitch between the antenna elements is shorter than both a pitch of the slices of adjacent blocks and a pitch of the slices within the block, and the pitch between the plurality of slices of the adjacent blocks is independent of the pitch between the plurality of antenna elements.

2. The phased array antenna according to claim 1, wherein the connector is a first coaxial connector mounted on a surface of the transmitter.

3. The phased array antenna according to claim 2, further comprising:

a second coaxial connector mounted on a surface of the high-frequency signal wiring layer; and a relay adapter to relay the first coaxial connector and the second coaxial connector.

4. The phased array antenna according to claim 3, wherein a maximum inclination angle of the relay adapter inside the through hole is an angle at which the first coaxial connector and the relay adapter can be fitted and the second coaxial connector and the relay adapter can be fitted.

5. The phased array antenna according to claim 4, wherein the through hole has a chamfer formed at an end portion of the through hole.

6. The phased array antenna according to claim 1, wherein the through hole does not intersect with the flow path.

7. The phased array antenna according to claim 1, wherein the block includes a capacitor bank to supplement power supply from the power source.

8. The phased array antenna according to claim 7, wherein the capacitor bank is attachable to and detachable from the bus board.

9. The phased array antenna according to claim 1, wherein the high-frequency signal wiring layer is disposed between the front plate and the antenna element layer, and is connected to the antenna element layer via the high-frequency signal wiring.

10. The phased array antenna according to claim 1, wherein the block is connected to the front plate via a thermal sheet.

11. The phased array antenna according to claim 3, wherein the relay adapter has protrusions at both ends thereof, the first coaxial connector has a hole into which the protrusion at one end of the relay adapter is fitted, and the second coaxial connector has a hole into which the protrusion at the other end of the relay adapter is fitted.

12. The phased array antenna according to claim 4, wherein the relay adapter has protrusions at both ends thereof, the first coaxial connector has a hole into which the protrusion at one end of the relay adapter is fitted, and the second coaxial connector has a hole into which the protrusion at the other end of the relay adapter is fitted.

13. The phased array antenna according to claim 5, wherein the relay adapter has protrusions at both ends thereof, the first coaxial connector has a hole into which the protrusion at one end of the relay adapter is fitted, and
the second coaxial connector has a hole into which the protrusion at the other end of the relay adapter is fitted.

* * * * *